(12) United States Patent
Lee et al.

(10) Patent No.: US 10,644,668 B2
(45) Date of Patent: May 5, 2020

(54) RESONATOR-BASED SENSOR AND SENSING METHOD THEREOF

(71) Applicant: ELECTRONICS AND TELECOMMUNICATIONS RESEARCH INSTITUTE, Daejeon (KR)

(72) Inventors: Hyunjoong Lee, Daejeon (KR); Yi-Gyeong Kim, Daejeon (KR); Yil Suk Yang, Daejeon (KR); Woo Seok Yang, Daejeon (KR); Chang Han Je, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/137,378

(22) Filed: Sep. 20, 2018

(65) Prior Publication Data
US 2019/0319599 A1    Oct. 17, 2019

(30) Foreign Application Priority Data

Apr. 11, 2018  (KR) .................. 10-2018-0042386

(51) Int. Cl.
*H03G 3/34* (2006.01)
*H03G 3/30* (2006.01)
*H03M 3/00* (2006.01)
*G01N 9/00* (2006.01)

(52) U.S. Cl.
CPC .......... *H03G 3/3036* (2013.01); *G01N 9/002* (2013.01); *H03M 3/488* (2013.01)

(58) Field of Classification Search
CPC .................. G01N 9/002; H03M 3/488
See application file for complete search history.

(56) References Cited

U.S. PATENT DOCUMENTS

| | | | |
|---|---|---|---|
| 5,995,925 A | 11/1999 | Emori | |
| 6,938,462 B2 | 9/2005 | Jakoby et al. | |
| 7,148,829 B2 | 12/2006 | Inukai | |
| 7,436,913 B2 | 10/2008 | Kang et al. | |
| 8,228,121 B2 | 7/2012 | Benhamouda et al. | |
| 8,476,970 B2 | 7/2013 | Mokhtar et al. | |
| 8,508,290 B2 | 8/2013 | Elsayed et al. | |
| 8,570,112 B2 * | 10/2013 | Yamakawa | H03B 5/30 331/116 M |

(Continued)

FOREIGN PATENT DOCUMENTS

KR    10-2013-0118303 A    10/2013

OTHER PUBLICATIONS

Julia Pettine et al., "Power-Efficient Oscillator-Based Readout Circuit for Multichannel Resonant Volatile Sensors", IEEE Transactions on Biomedical Circuits and Systems, Dec. 2012, pp. 542-551, vol. 6, No. 6, IEEE.

(Continued)

*Primary Examiner* — Qutbuddin Ghulamali (57) ABSTRACT

A resonator-based sensor and a sensing method thereof for sensing a change in a material that is subject to be sensed which include: generating an oscillation voltage signal by amplifying a current signal output from a resonator in accordance with a physical-chemical change of the material; and generating a gain control signal corresponding to a motional resistance and a clock signal corresponding to a resonant frequency of the resonator are provided.

12 Claims, 9 Drawing Sheets

(56) References Cited

U.S. PATENT DOCUMENTS

| | | |
|---|---|---|
| 9,013,233 B2 | 4/2015 | Elmallah et al. |
| 10,418,962 B2 * | 9/2019 | Kuisma ............. G01C 19/5726 |
| 2014/0184333 A1 | 7/2014 | Lee et al. |
| 2015/0226556 A1 * | 8/2015 | Aaltonen ........... G01C 19/5712 |
| | | 73/504.12 |

OTHER PUBLICATIONS

Yu-Wei Lin et al., "Series-Resonant VHF Micromechanical Resonator Reference Oscillators", IEEE Journal of Solid-State Circuits, Dec. 2004, pp. 2477-2491, vol. 39, No. 12, IEEE.

* cited by examiner

RESONATOR-BASED SENSOR AND SENSING METHOD THEREOF

CROSS-REFERENCE TO RELATED APPLICATION

This application claims priority to and the benefit of Korean Patent Applications No. 10-2018-0042386 filed in the Korean Intellectual Property Office on Apr. 11, 2018, the entire contents of which are incorporated herein by reference.

BACKGROUND OF THE INVENTION

(a) Field of the Invention

This disclosure relates to a resonator-based sensor and a sensing method thereof.

(b) Description of the Related Art

An electro-mechanical resonator has a resonant frequency and a quality factor (Q-factor) that depend on physical characteristics of a material constituting a structure, the shape of the structure, and the environment around the structure. If the mass of the entire structure changes due to the mass of a material attached to the surface of the structure or if the viscosity or density of a material surrounding the structure changes, the resonant frequency and Q-factor of the resonator structure are changed accordingly. The physical-chemical changes of the material attached to the structure or surrounding the structure can be measured by constituting an oscillation circuit using the resonator structure and electrically measuring the change of the resonant frequency and the Q-factor of the resonator structure. Since the Q-factor is inversely proportional to a motional resistance corresponding to an electrical equivalent resistance of the resonator structure, if the motional resistance is accurately measured, the change in the viscosity or density of the material surrounding the structure can also be accurately measured. Because the motional resistance is also a source of disturbing the driving operation of the oscillation circuit driving the resonator, an automatic gain control (AGC) circuit is generally added to the oscillation circuit so that stable oscillation of the output signal can be maintained. Researches have been conducted to find the resonant frequency and the motional resistance by measuring a frequency of the output signal of the oscillation circuit and the gain control signal of the AGC circuit.

A resonator-based sensor may include the oscillator that uses the electro-mechanical resonator structure, and may be used for measuring the change in the resonant frequency and the motional resistance of the structure depending on physical-chemical changes in the material that is subject to be sensed. The mass, viscosity, density, etc. of the material that is subject to be sensed can be known based on the change of the resonance frequency and the motional resistance measured by the resonator-based sensor. The resonator-based sensor requires an AGC function to maintain the amplitude of the output signal to be constant while maintaining the oscillation. If the oscillation of the resonator-based sensor is held constant, the resonance frequency and motional resistance value of the resonator can be accurately obtained from the output signal frequency of the oscillation circuit and the gain control signal of the AGC circuit. Further, in order to measure the resonance frequency and the motional resistance value at a high resolution, the output signal of the oscillation circuit needs to be obtained in a digital manner. If the output signal of the oscillation circuit is digitally obtained, robustness against various noise components and process variations can be expected, and ease of transmission is also easy to secure.

SUMMARY OF THE INVENTION

An exemplary embodiment provides a resonator-based sensor for sensing a change in a material that is to be sensed by sensing values corresponding to a resonant frequency and a motional resistance of the resonator.

Another exemplary embodiment provides a method for sensing a change in a material that is to be sensed by sensing values corresponding to a resonant frequency and a motional resistance of the resonator.

Yet another exemplary embodiment provides a digital AGC for controlling an oscillation circuit of a resonator-based sensor which senses a change in a material that is to be sensed.

According to an exemplary embodiment, a resonator-based sensor for sensing a change in a material is provided. The resonator-based sensor includes: a resonator configured to output a current signal according to a physical-chemical change of the material; an amplifier configured to amplify the current signal to generate an oscillation voltage signal; and a digital automatic gain controller (AGC) configured to generate a clock signal corresponding to a resonance frequency of the resonator and a gain control signal corresponding to a motional resistance of the resonator based on the oscillation voltage signal, wherein the amplifier is controlled by the gain control signal.

The digital AGC may include a down-mixing envelope tracker configured to generate an m-bit digital signal according to a magnitude of an envelope of the oscillation voltage signal, wherein the m-bit digital signal may correspond to a magnitude of the motional resistance.

The down-mixing envelope tracker may include: a comparator configured to compare the oscillation voltage signal with a reference threshold to output an up/down signal; a counter configured to generate a counting signal according to a magnitude of the up/down signal; a low pass filter configured to filter the counting signal at a low frequency band; and a down sampler configured to down-sample the low-pass filtered signal to output the m-bit digital signal, wherein a number of bits of the m-bit digital signal may be greater than a number of bits of the counting signal.

The digital AGC may further include a delta-sigma modulator configured to modulate a remaining (m-n)-bit signal generated by subtracting an n-bit coarse signal from the m-bit digital signal in a delta-sigma modulation scheme to generate a 1-bit fine signal, wherein the gain control signal may be a sum of the n-bit coarse signal and the 1-bit fine signal.

The digital AGC may further include a clock generator configured to convert the oscillation voltage signal to a digital voltage signal and generate a plurality of clock signals by adjusting a phase or a frequency of the digital voltage signal, wherein the frequency of the digital voltage signal may correspond to the resonance frequency.

The plurality of clock signals may include a first clock signal provided to the down-mixing envelope tracker and a second clock signal provided to the delta-sigma modulator, wherein the first clock signal may have a same frequency as a frequency of the digital voltage signal, and the second clock signal may have a frequency that is higher than a frequency of the m-bit digital signal.

A magnitude of the oscillation voltage signal may be a product of a magnitude of the current signal and a magnitude of a variable resistance determined according to the gain control signal.

Another exemplary embodiment provides a method for sensing a change in a material. The sensing method based on a resonator includes: generating an oscillation voltage signal by amplifying a current signal output from a resonator according to a physical-chemical change of the material; and generating a clock signal corresponding to a resonance frequency of the resonator and a gain control signal corresponding to a motional resistance of the resonator based on the oscillation voltage signal, wherein an amplifier generating the oscillation voltage signal is controlled by the gain control signal.

The generating a clock signal corresponding to a resonance frequency of the resonator and a gain control signal corresponding to a motional resistance of the resonator based on the oscillation voltage signal may include generating an m-bit digital signal according to a magnitude of an envelope of the oscillation voltage signal, wherein the m-bit digital signal may correspond to a magnitude of the motional resistance, The generating an m-bit digital signal according to a magnitude of an envelope of the oscillation voltage signal may include: outputting an up/down signal by comparing the oscillation voltage signal with a reference threshold; generating a counting signal according to the up/down signal; filtering the counting signal at a low frequency band; and outputting the m-bit digital signal by performing down-sampling of the low-pass filtered signal, wherein a number of bits of the m-bit digital signal may be greater than a number of bits of the counting signal.

The generating a clock signal corresponding to a resonance frequency of the resonator and a gain control signal corresponding to a motional resistance of the resonator based on the oscillation voltage signal may include: generating a 1-bit fine signal by modulating a remaining (m-n)-bit signal generated by subtracting an n-bit coarse signal from the m-bit digital signal in a delta-sigma modulation scheme; and generating the gain control signal by summing the n-bit coarse signal and the 1-bit fine signal.

The generating a clock signal corresponding to a resonance frequency of the resonator and a gain control signal corresponding to a motional resistance of the resonator based on the oscillation voltage signal may further include converting the oscillation voltage signal to a digital voltage signal and generating a plurality of clock signals by adjusting a phase or a frequency of the digital voltage signal, wherein the frequency of the digital voltage signal may correspond to the resonance frequency.

The plurality of clock signals may include a first clock signal provided to the down-mixing envelope tracker and a second clock signal provided to the delta-sigma modulator, wherein the first clock signal may have a same frequency as a frequency of the digital voltage signal, and the second clock signal may have a frequency that is higher than a frequency of the m-bit digital signal.

A magnitude of the oscillation voltage signal may be a product of a magnitude of the current signal and a magnitude of a variable resistance determined according to the gain control signal.

Yet another exemplary embodiment provides a digital automatic gain controller (AGC) for controlling an oscillation circuit of a resonator-based sensor which senses a change in a material. The digital AGC includes: a down-mixing envelope tracker configured to generate an m-bit digital signal according to a magnitude of an envelope of an oscillation voltage signal; and a delta-sigma modulator configured to modulate a remaining (m-n)-bit signal generated by subtracting an n-bit coarse signal from the m-bit digital signal in a delta-sigma modulation scheme to generate a 1-bit fine signal, wherein the m-bit digital signal corresponds to a magnitude of a motional resistance of a resonator included in the oscillation circuit and a gain control signal for controlling the oscillation circuit is a sum of the coarse signal and the fine signal.

The down-mixing envelope tracker may include: a comparator configured to compare the oscillation voltage signal and a reference threshold to output an up/down signal; a counter configured to generate a counting signal according to the up/down signal; a low-pass filter configured to low-pass filter the counting signal; and a down sampler configured to down-sample the low-pass filtered signal to output the m-bit digital signal, wherein a number of bits of the m-bit digital signal may be larger than a number of bits of the counting signal.

The digital AGC of claim 16 may further include a clock generator configured to generate a plurality of clock signals by converting the oscillation voltage signal to a digital voltage signal and adjusting a phase or a frequency of the digital voltage signal, wherein the frequency of the digital voltage signal may correspond to the resonant frequency.

The plurality of clock signals may include a first clock signal provided to the down-mixing envelope tracker and a second clock signal provided to the delta-sigma modulator, wherein the first clock signal may have the same frequency as the frequency of the digital voltage signal and the second clock signal may have a higher frequency than a frequency of the m-bit digital signal.

A magnitude of the oscillation voltage signal may be a product of a magnitude of a current signal output from the resonator and a magnitude of a variable resistor of the oscillation circuit determined according to the gain control signal.

DETAILED DESCRIPTION OF THE EMBODIMENTS

Hereinafter, exemplary embodiments of the present disclosure will be described in detail with reference to the accompanying drawings so that those skilled in the art may easily practice the present disclosure. However, the present disclosure may be modified in various different ways and is not limited to embodiments described herein. In the accompanying drawings, portions unrelated to the description will be omitted in order to obviously describe the present disclosure, and similar reference numerals will be used to describe similar portions throughout the present specification.

Figure 1:
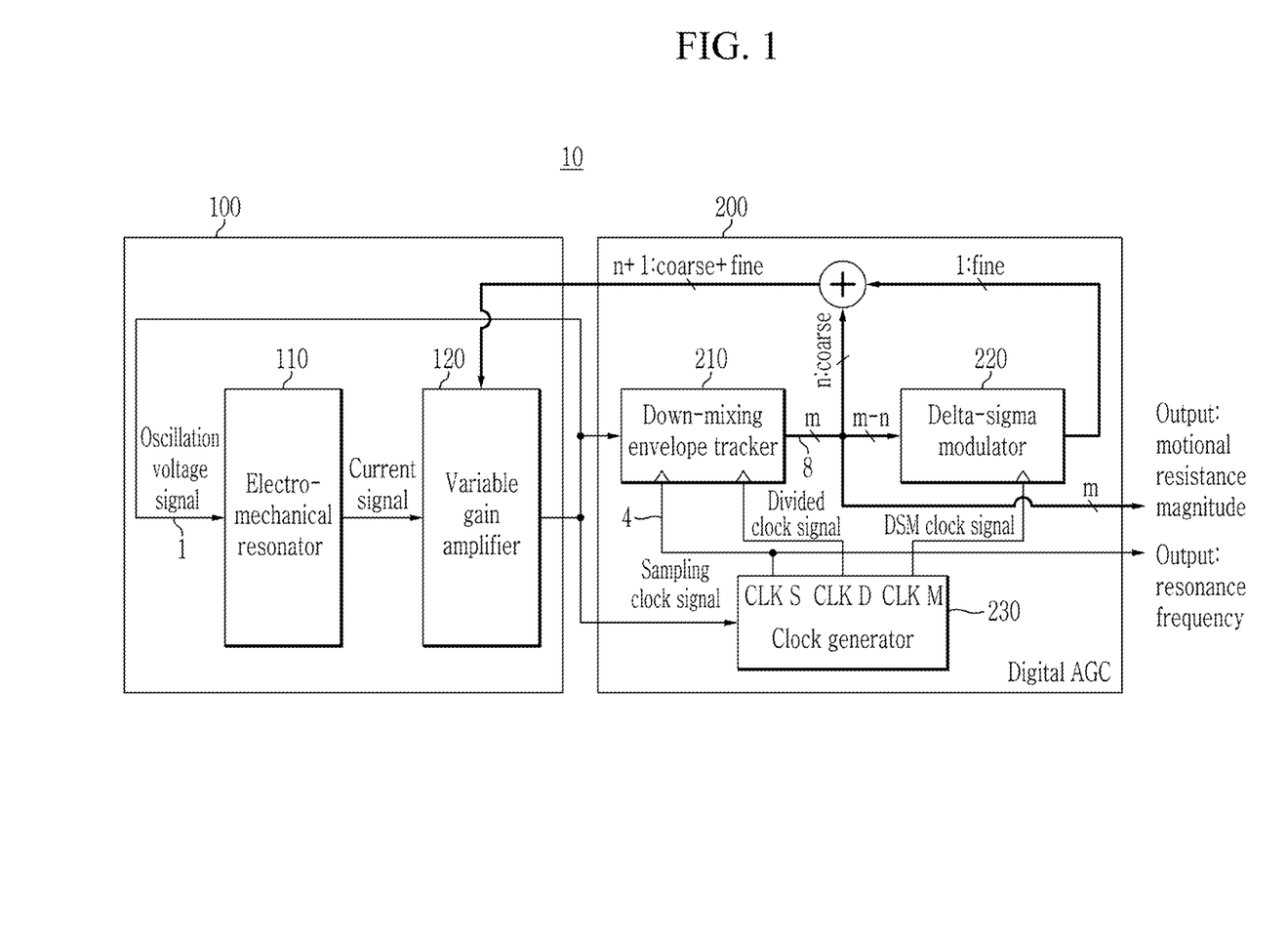
FIG. 1 is a block diagram illustrating a resonator-based sensor according to an exemplary embodiment.

FIG. 1 is a block diagram illustrating a resonator-based sensor according to an exemplary embodiment.

Referring to FIG. 1, a resonator-based sensor 10 according to an exemplary embodiment includes electro-mechanical resonator 110, a variable gain amplifier 120, and a digital AGC 200. The variable gain amplifier 120 of the resonator-based sensor 10 amplifies a current signal output from the electro-mechanical resonator 110. Then, the digital AGC 200 analyzes the amplified current signal to sense a change of a resonant frequency and a motional resistance of a resonator. The change of the resonant frequency and the motional resistance of the electro-mechanical resonator 110 may represent a physical-chemical change of a material that is subject to be sensed and which is attached to the electro-mechanical resonator 110. That is, since the resonant frequency or the motional resistance of the electro-mechanical resonator changes depending on the physical-chemical change of the material that is subject to be sensed and which is adhered to the electro-mechanical resonator 110 of the resonator-based sensor 10, the resonator-based sensor 10 may find characteristics of the material to be sensed by sensing the change in the resonant frequency and/or the motional resistance of the electro-mechanical resonator 110.

The resonant frequency and the motional resistance of the electro-mechanical resonator 110 may be changed according to the physical and chemical changes of the material to be sensed. An equivalent model of the electro-mechanical resonator 110 is a series and parallel connection of electrical element such as resistors, capacitors, and inductors. The electro-mechanical resonator 110 may output a current signal, and the output current signal is input to the variable gain amplifier 120.

The variable gain amplifier 120 may output a voltage signal by amplifying the input current signal. The variable gain amplifier 120 may operate so as to make the phase differences between an input signal and an output signal close to 0 degrees. The voltage signal output from the variable gain amplifier 120 is input as a drive signal of the electro-mechanical resonator 110. That is, the electro-mechanical resonator 110 and the variable gain amplifier 120 of the resonator-based sensor 10 may form an oscillation circuit 100 having a feedback loop.

The digital AGC 200 may maintain the normal operation of the current signal output from the electro-mechanical resonator 110 by adjusting amplitude of the output signal of the variable gain amplifier 120 to a predetermined magnitude. The digital AGC 200 may generate a clock signal corresponding to the resonant frequency of the electro-mechanical resonator 110 and a gain control signal corresponding to the motional resistance of the electro-mechanical resonator 110 based on the output signal of the variable gain amplifier 120.

The digital AGC 200 includes a down-mixing envelope tracker 210, a delta-sigma modulator 220, and a clock generator 230. The digital AGC 200 may represent the magnitude of the motional resistance of the electro-mechanical resonator 110 in a digital form and a signal corresponding to the resonant frequency in a digital level. The gain control signal used to control the gain of the variable gain amplifier 120 may be generated from the digital representation of the magnitude of the motional resistance.

The down-mixing envelope tracker 210 may generate an m-bit digital signal according to a magnitude of an envelope of the output signal of the oscillation circuit 100. The m-bit signal corresponding to the magnitude of the envelope of the oscillation circuit, which is generated by the down-mixing envelope tracker 210, may correspond to the motional resistance of the electro-mechanical resonator 110 according to the exemplary embodiment.

The delta-sigma modulator 220 may modulate a remaining (m-n)-bit signal generated by subtracting an n-bit coarse signal from the m-bit digital signal to generate a 1-bit fine signal. The delta-sigma modulator 220 according to the exemplary embodiment may modulate the (m-n)-bit signal based on a delta-sigma modulation scheme. The n-bit coarse signal and the 1-bit fine signal are summed to provide an (n+1)-bit coarse-fine gain control signal for controlling the gain of the variable gain amplifier 120. The variable gain amplifier 120 may adjust the amplitude of the output signal according to the (n+1)-bit coarse-fine gain control signal.

The clock generator 230 may generate an operating clock signal to drive the digital AGC 200 based on the output signal of the oscillation circuit 100. The clock generator 230 may generate a sampling clock signal for the sampling operation of the down-mixing envelope tracker 210. The frequency of the sampling clock signal may be the same as the frequency of the output digital signal of the oscillation circuit 100, and the phase of the sampling clock signal may have a delay of 90 degrees from the phase of the output signal of the oscillation circuit 100. According to the exemplary embodiment, the frequency of the sampling clock signal corresponds to the resonant frequency of the electro-mechanical resonator 110. Further, the clock generator 230 may provide a divided clock signal to the down-mixing envelope tracker 210 for a down-sampling operation of the down-mixing envelope tracker 210. Furthermore, the clock generator 230 may generate a delta-sigma modulation DSM clock signal for the operation of the delta-sigma modulator 220. In the delta-sigma modulation scheme, the delta-sigma modulator 220 may perform a noise shaping operation and an oversampling operation when an operating clock signal faster (i.e., a higher frequency) than the input signal (m-bit digital signal 8) is provided. Therefore, the DSM clock signal may be same as the sampling clock, or slower than the sampling clock, and faster than the divided clock.

Hereinafter, the operation of the digital AGC 200 is described in detail with reference to FIGS. 2 to 4.

Figure 2:
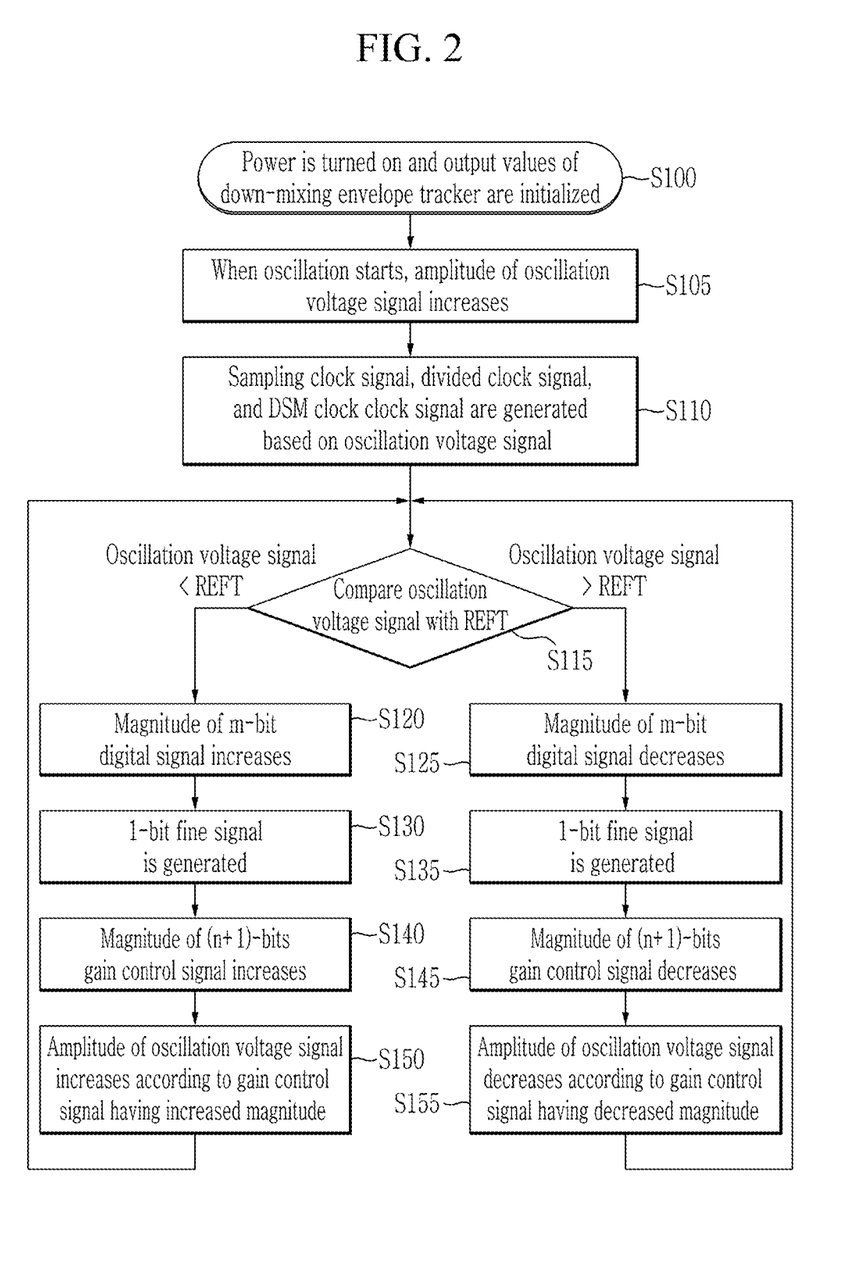
FIG. 2 is a flowchart illustrating the operation of the digital AGC according to an exemplary embodiment.
Figure 3:
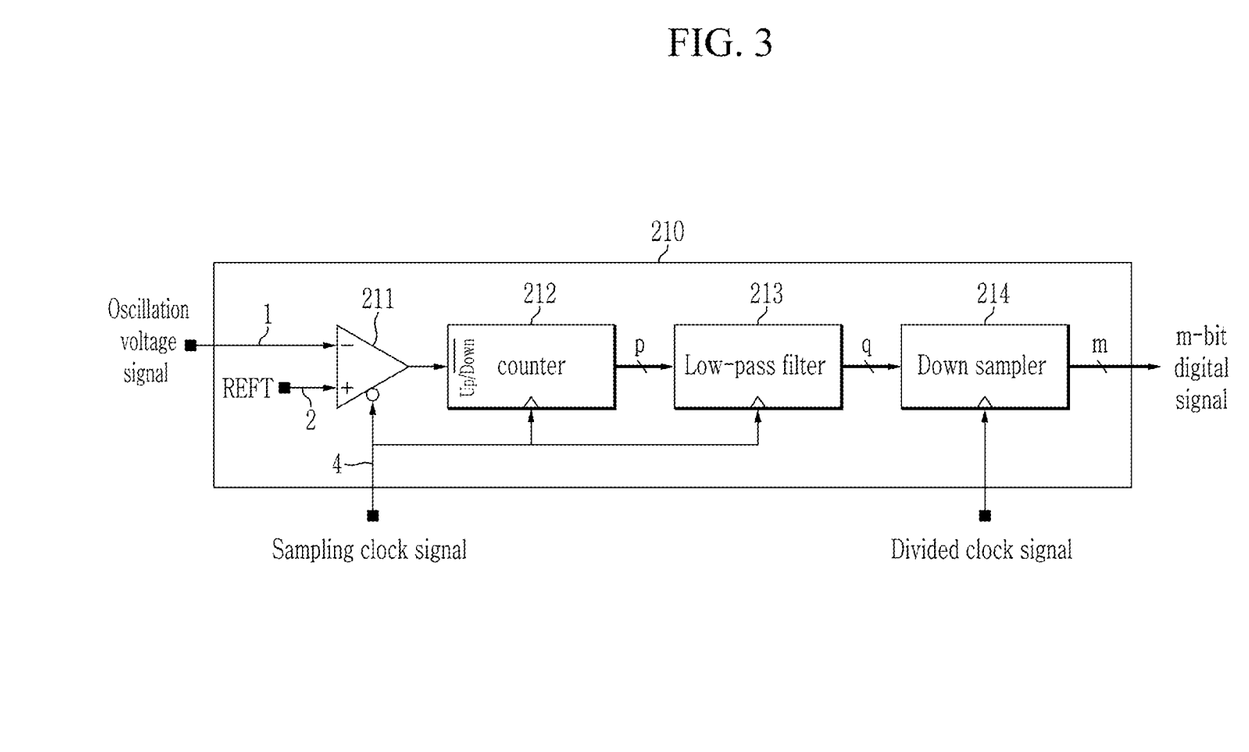
FIG. 3 is a block diagram illustrating the down-mixing envelope tracker according to an exemplary embodiment.
Figure 4:
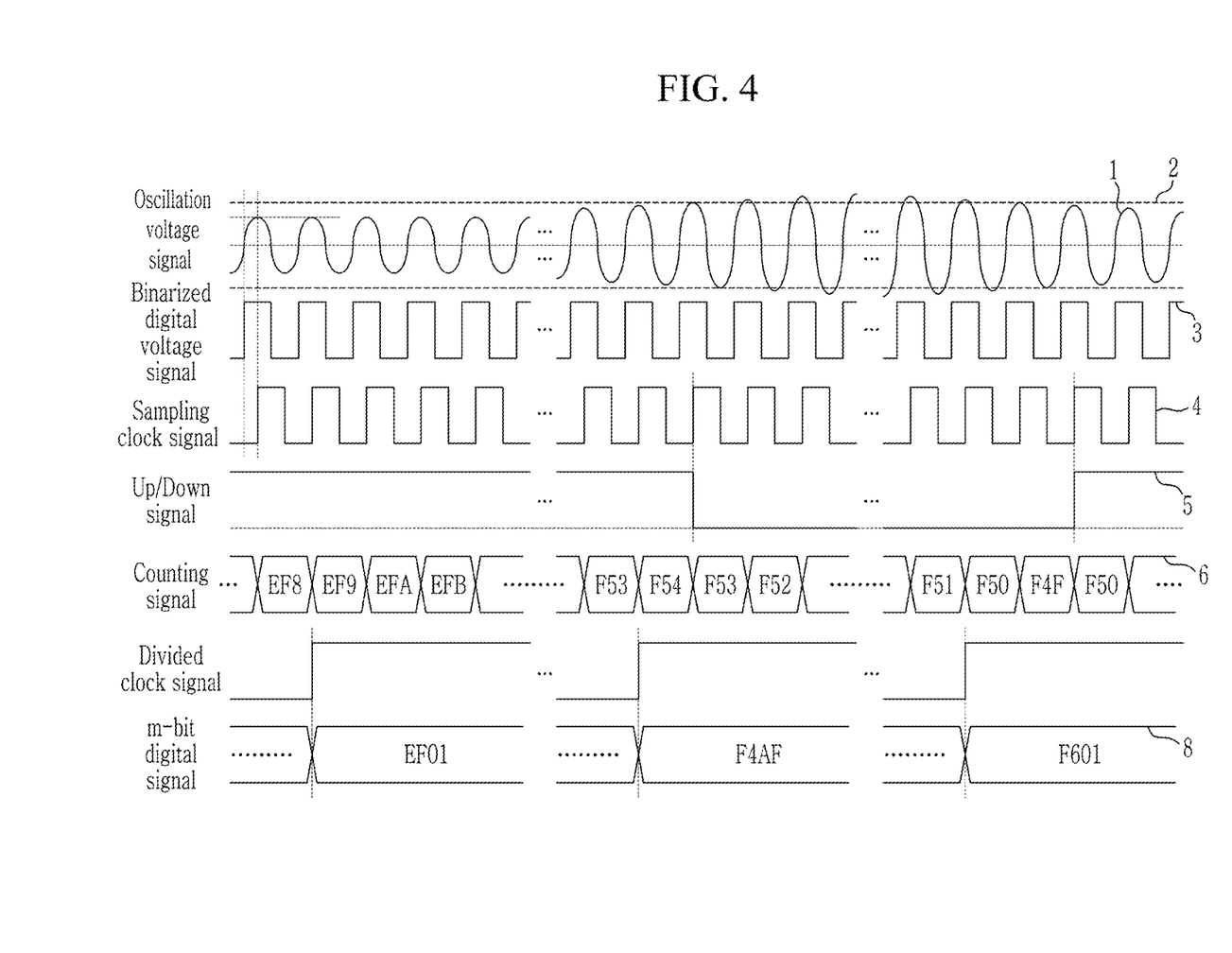
FIG. 4 is a schematic diagram illustrating operation timing of each block of the down-mixing envelope tracker according to an exemplary embodiment.

FIG. 2 is a flowchart illustrating the operation of the digital AGC according to an exemplary embodiment, FIG. 3 is a block diagram illustrating the down-mixing envelope tracker according to an exemplary embodiment, and FIG. 4 is a schematic diagram illustrating operation timing of each block of the down-mixing envelope tracker according to an exemplary embodiment.

Referring to FIG. 2, when the resonator-based sensor 10 according to the exemplary embodiment is turned on, output values of each element of the down-mixing envelope tracker 210 are initialized (S100). Referring to FIG. 3, the down-mixing envelope tracker 210 may include a sampling comparator 211, an up/down counter 212, a low-pass filter 213, and a down-sampler 214. The output values set to the maximum value after the resonator-based sensor 10 is turned on are an output value of the up/down counter 212 (p-bit), an output value of the low-pass filter 213 (q-bit), and an output value of the down-sampler 214 (m-bit). The output value m of the down sampler 214 is the output signal of the down-mixing envelope tracker 210.

When oscillations start on the electro-mechanical resonator 110, the amplitude of the oscillation voltage signal 1 of the electro-mechanical resonator 110 starts to increase (S105). Then, the clock generator 230 generates the sampling clock, the divided clock, and the DSM clock signal based on the oscillation voltage signal of the resonator 110 (S110). The sampling clock signal may be used in the sampling comparator 211, the up/down counter 212, and the low-pass filter 213, the divided clock signal may be used in the down sampler 214, and the DSM clock signal may be used in delta-sigma modulator 220.

The sampling comparator 211 of the down-mixing envelope tracker 210 outputs an up/down signal 5 by comparing the oscillation voltage signal 1 output from the oscillation circuit 100 with a reference threshold REFT 2 (S115). Referring to FIG. 4, when the REFT 2 is larger than the oscillation voltage signal 1, the up/down signal 5 output from the sampling comparator 211 maintains an UP state. On the other hand, when the REFT 2 is smaller than the oscillation voltage signal 1, the sampling comparator 211 may switch the state of the up/down signal 5 into the DOWN state.

Referring to FIG. 4, a relationship between the oscillation voltage signal 1 and the sampling clock signal 4 is shown. Since the clock generator 230 according to the exemplary embodiment generates the sampling clock signal based on the oscillation voltage signal 1, the resonator-based sensor 10 does not require a clock signal provided from the outside. The clock generator 230 may generate the sampling clock signal 4 by obtaining a digital voltage signal 3 from a signal thresholding operation of the oscillation voltage signal 1 and delaying the phase of the digital voltage signal 3 by 90 degrees. Referring to FIG. 4, the digital voltage signal 3 is a digitalized signal of the oscillation voltage signal 1, and the sampling clock signal 4 has a phase that is 90 degrees slower than the digital voltage signal 3. That is, the resonator-based sensor 10 may perform self-sampling through the clock generator 230 based on the internal digital voltage signal.

The up/down counter 212 generates a p-bit counting signal 6 according to the magnitude of the up/down signal 5 of the sampling comparator 211. Referring to FIG. 4, the counting signal 6 is represented by 12 bits. For example, EF8 is a 4-bit hexadecimal representation, and the binary number of the EF8 is '111011111000'. The bit of the counting signal 6 increases when the up/down signal 5 is in the UP state (EF8 to F54), decreases when the up/down signal 5 is changed to the DOWN state (F54→F53), and increases again when the up/down signal 5 is switched to the UP state (F4F→F50).

The low-pass filter 213 may output a q-bit filtered signal by performing low-pass filtering on the p-bit counting signal. The number of bits (q bits) of the filtered signal may be greater than the number of bits (p bits) of the counting signal 6. Then, the down-sampler 214 may down-sample the filtered signal to output an m-bit high resolution digital signal 8. In FIG. 4, the digital signal 8 is represented by 16 bits. Since the DSM clock signal provided to the delta-sigma modulator 220 which processes some of the m-bit digital signals 8 has the same frequency or a lower frequency than that of the sampling clock, the frequency of the m-bit digital signal 8 may be slower than the frequency of the sampling clock. The number of bits (m bits) of the digital signal 8 output from the down-mixing envelope tracker 210 may be the same as or less than the number of bits (q bits) of the filtered signal. The number of bits of the digital signal 8 is larger than the number of bits of the counting signal.

Referring to FIG. 2, when the oscillation voltage signal 1 is smaller than the reference threshold 2, the magnitude of the m-bit digital signal 8 increases (S120), and when the oscillation voltage signal 1 is larger than the reference threshold 2, the magnitude of the m-bit digital signal 8 decreases (S125). When the magnitude of the digital signal 8 increases since the oscillation voltage signal 1 is smaller than the reference threshold 2, the magnitude of the (n+1)-bit gain control signal also increases (S140). The gain control signal is a sum of the 1-bit fine signal (S130) output from the delta-sigma modulator 220 and the n-bit coarse signal separated from the digital signal 8. Then, the gain of the variable gain amplifier 120 increases in accordance with the gain control signal, therefore the amplitude of the oscillation voltage signal 1 of the oscillation circuit also increases (S150), so that the amplitude of the oscillation voltage signal 1 can be maintained in a constant range. When the magnitude of the digital signal 8 decreases since the oscillation voltage signal 1 is larger than the reference threshold 2, the magnitude of the (n+1)-bit gain control signal also decreases (S145). The (n+1)-bit gain control signal is a sum of the 1-bit fine signal (S135) output from the delta-sigma modulator 220 and the n-bit coarse signal from the digital signal 8. Then, the gain of the variable gain amplifier 120 decreases in accordance with the gain control signal, therefore the amplitude of the oscillation voltage signal 1 of the oscillation circuit also decreases (S155), so that the amplitude of the oscillation voltage signal 1 can be maintained in a constant range. That is, according to the exemplary embodiment, the amplification of the oscillation signal of the resonator may be controlled by using only (n+1) bits out of the m bits.

FIGS. 5A to 5D are schematic diagram illustrating the variable gain amplifier according to exemplary embodiments.

Figure 5A:
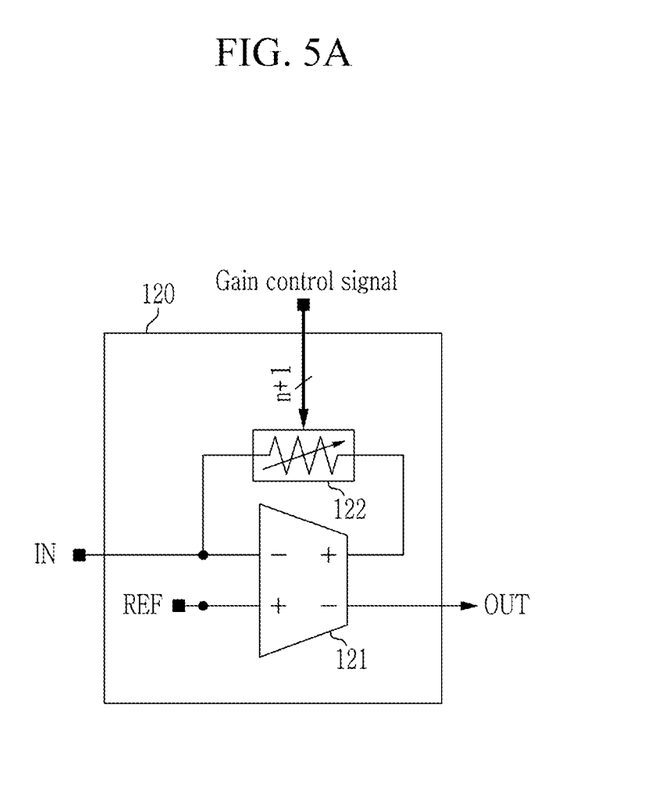
FIGS. 5A to 5D are schematic diagram illustrating the variable gain amplifier according to exemplary embodiments.

Referring to FIG. 5A, the variable gain amplifier 120 includes a differential operational-amplifier (OP-AMP) 121 and a digitally-controlled variable resistor 122. The magnitude of the variable resistor 122 is controlled by the gain control signal of the digital AGC 200. A current signal output from the electro-mechanical resonator 110 is input to a negative input end of the differential OP-AMP 121 connected with one end of the variable resistor 122. A reference voltage is input to a positive input end of the differential OP-AMP 121. A positive output end of the differential OP-AMP 121 is connected to the opposite end of the variable resistor 122, and a signal output from a negative output end is an output voltage signal of the variable gain amplifier 120. In FIG. 5A, the magnitude of the output voltage signal may be calculated as a product of the input current signal and the magnitude of the variable resistor. In this case, the phase difference between the input current signal and the output voltage signal is 0 degrees.

Figure 5B:
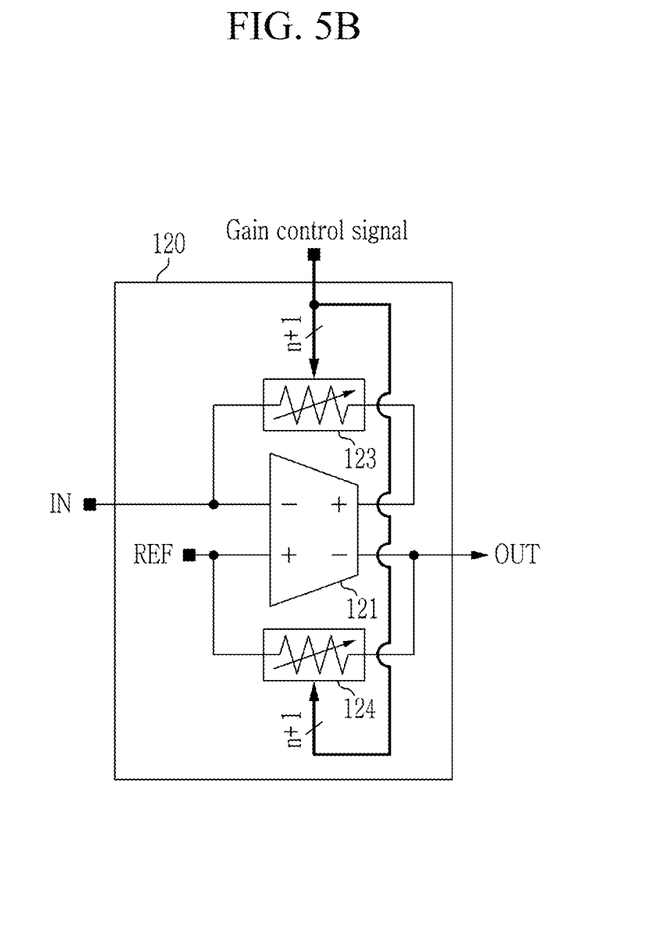

Referring to FIG. 5B, the variable gain amplifier 120 includes a differential OP-AMP 121, a digitally-controlled first variable resistor 123, and a digitally-controlled second variable resistor 124. The magnitudes of the first variable resistor 123 and the second variable resistor 124 may be controlled by the gain control signal of the digital AGC 200. A current signal output from the electro-mechanical resonator 110 is input to a negative input end of the differential OP-AMP 121 connected with one end of the first variable resistor 123. A reference voltage is input to a positive input end of the differential OP-AMP 121 connected with one end of the second variable resistor 124. A positive output end of the differential OP-AMP 121 is connected to the opposite end of the first variable resistor 123, and a signal from a negative output end connected to the opposite end of the second variable resistor 124 is an output voltage signal of the variable gain amplifier 120.

Figure 5C:
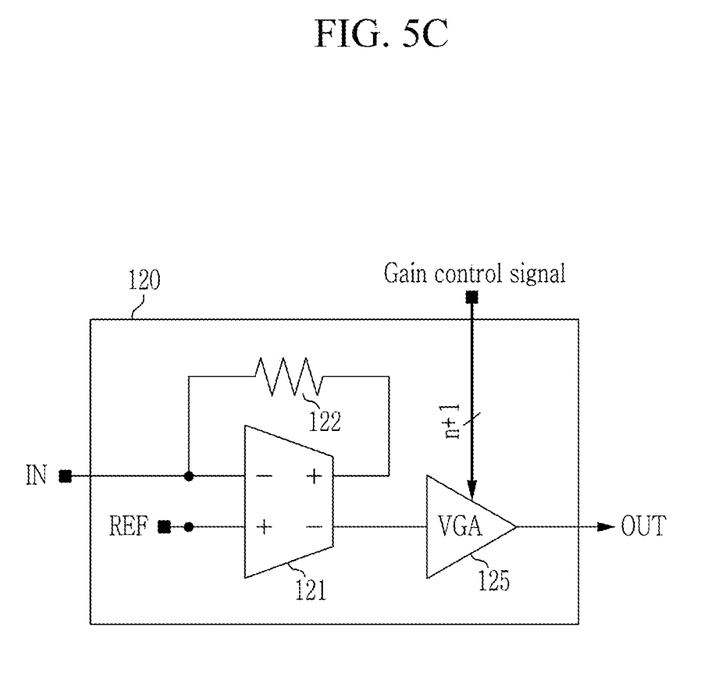

The variable gain amplifier 120 of FIG. 5C includes the variable gain amplifier 120 of FIG. 5A and a variable gain amplification unit (VGA unit) 125 connected to the negative output end of the differential OP-AMP 121 of FIG. 5A. The variable resistor 122 of FIG. 5A is changed to a general resistor of which magnitude is fixed in FIG. 5C. Therefore, the variable gain amplifier 120 of FIG. 5C may output the oscillation voltage signal 1 by controlling a gain of the VGA unit 125 based on the gain control signal.

Figure 5D:
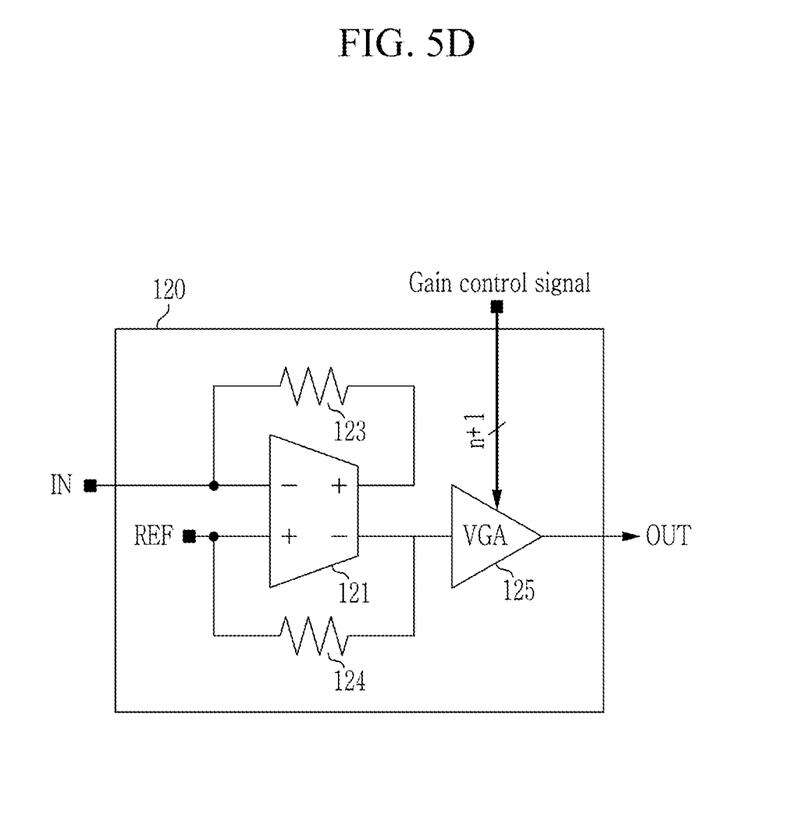

The variable gain amplifier 120 of FIG. 5D includes the variable gain amplifier 120 of FIG. 5B and a VGA unit 125 connected to the negative output end of the differential OP-AMP 121 of FIG. 5B. The first variable resistor 123 and the second variable resistor 124 of FIG. 5B are changed to general resistors of which magnitudes are fixed, respectively, in FIG. 5D. Therefore, the variable gain amplifier 120 of FIG. 5D may output the oscillation voltage signal 1 by controlling a gain of the VGA unit 125 based on the gain control signal.

As described above, the resonator-based sensor according to exemplary embodiments can self-generate the clock signal for controlling the amplification of the oscillation signal of the resonator by using a small number of bits and driving each component of the resonator-based sensor based on the oscillation signal of the resonator.

Figure 6:
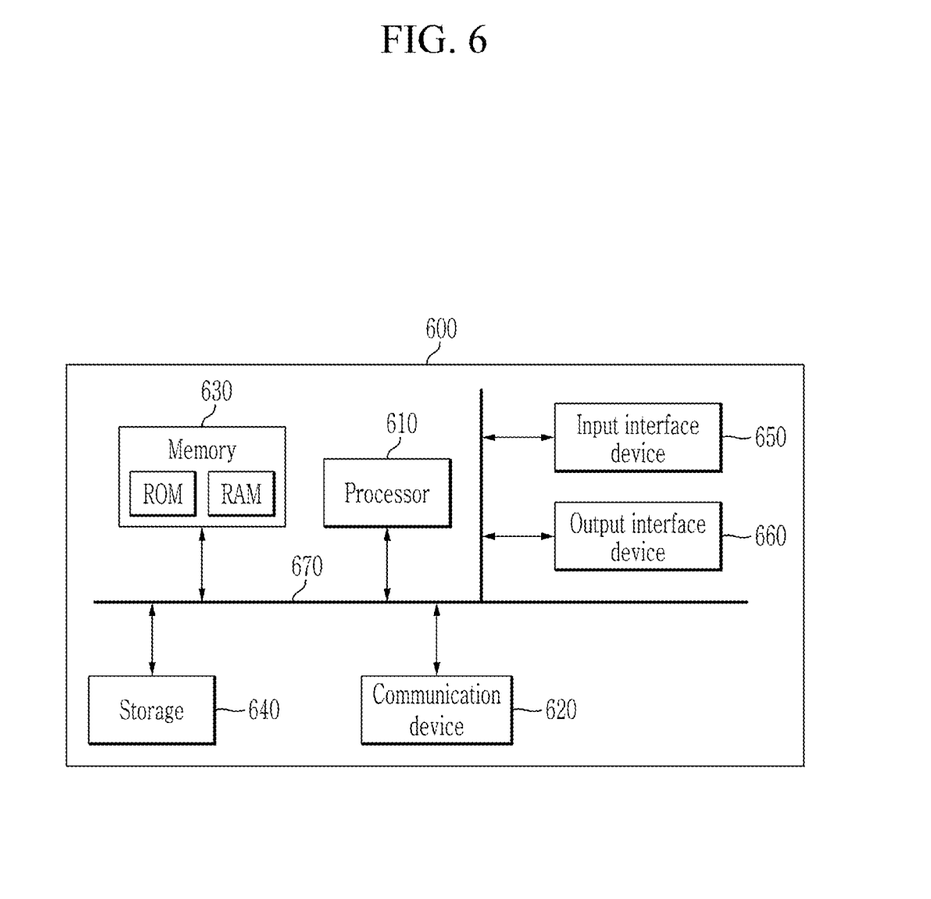
FIG. 6 is a block diagram illustrating a digital AGC according to another exemplary embodiment.

FIG. 6 is a block diagram illustrating a digital AGC according to another exemplary embodiment.

A digital AGC according to the current exemplary embodiment may be implemented as a computer system, e.g., a computer readable medium. Referring to FIG. 6, the computer system 600 may include at least one of a processor 610 communicating via a bus 670, a memory 630, an input interface device 650, an output interface device 660, and storage 640. The computer system 600 also may include a communication device 620 coupled to the network. The processor 610 may be a central processing unit (CPU) or a semiconductor device that executes instructions stored in the memory 630 or the storage device 640. The memory 630 and the storage device 640 may include various forms of volatile or non-volatile storage media. For example, the memory 630 may include a read only memory (ROM) and a random access memory (RAM). In the exemplary embodiments of the present disclosure, the memory may be located inside or outside the processor, and the memory may be coupled to the processor through various means that are already known.

Thus, the exemplary embodiments may be implemented as a computer-implemented method or as a non-volatile computer-readable medium having computer-executable instructions stored thereon. In an exemplary embodiment, when executed by a processor, the computer-readable instructions may perform the method according to at least one aspect of the present disclosure.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A resonator-based sensor for sensing a change in a material, comprising:
a resonator configured to output a current signal according to a physical-chemical change of the material;
an amplifier configured to amplify the current signal to generate an oscillation voltage signal; and
a digital automatic gain controller (AGC) configured to generate a clock signal corresponding to a resonance frequency of the resonator and a gain control signal corresponding to a motional resistance of the resonator based on the oscillation voltage signal,
wherein the amplifier is controlled by the gain control signal, and the digital AGC includes a down-mixing envelope tracker configured to generate an m-bit digital signal according to a magnitude of an envelope of the oscillation voltage signal, wherein the m-bit digital signal corresponds to a magnitude of the motional resistance.

2. The resonator of claim 1, wherein the down-mixing envelope tracker comprises:
a comparator configured to compare the oscillation voltage signal with a reference threshold to output an up/down signal;
a counter configured to generate a counting signal according to the up/down signal;
a low pass filter configured to filter the counting signal at a low frequency band; and
a down sampler configured to down-sample the low-pass filtered signal to output the m-bit digital signal,
wherein a number of bits of the m-bit digital signal is greater than a number of bits of the counting signal.

3. The resonator of claim 1, wherein the digital AGC further comprises
a delta-sigma modulator configured to modulate a remaining (m-n)-bit signal generated by subtracting an n-bit coarse signal from the m-bit digital signal in a delta-sigma modulation scheme to generate a 1-bit fine signal, wherein the gain control signal is a sum of the n-bit coarse signal and the 1-bit fine signal.

4. The resonator of claim 3, wherein the digital AGC further comprises
a clock generator configured to convert the oscillation voltage signal to a digital voltage signal and generate a plurality of clock signals by adjusting a phase or a frequency of the digital voltage signal, wherein the frequency of the digital voltage signal corresponds to the resonance frequency.

5. The resonator of claim 4,
wherein the plurality of clock signals include a first clock signal provided to the down-mixing envelope tracker and a second clock signal provided to the delta-sigma modulator, and wherein the first clock signal has a same frequency as a frequency of the digital voltage signal and the second clock signal has a frequency that is higher than a frequency of the m-bit digital signal.

6. The resonator of claim 1,
wherein a magnitude of the oscillation voltage signal is a product of a magnitude of the current signal and a magnitude of a variable resistance determined according to the gain control signal.

7. A method for sensing a change in a material, comprising:
generating an oscillation voltage signal by amplifying a current signal output from a resonator according to a physical-chemical change of the material; and
generating a clock signal corresponding to a resonance frequency of the resonator and a gain control signal corresponding to a motional resistance of the resonator based on the oscillation voltage signal,
wherein an amplifier generating the oscillation voltage signal is controlled by the gain control signal, and
wherein the generating a clock signal corresponding to a resonance frequency of the resonator and a gain control signal corresponding to a motional resistance of the resonator based on the oscillation voltage signal comprises generating an m-bit digital signal according to a magnitude of an envelope of the oscillation voltage signal, the m-bit digital signal corresponding to a magnitude of the motional resistance.

8. The method of claim 7,
wherein the generating an m-bit digital signal according to a magnitude of an envelope of the oscillation voltage signal comprises:
outputting an up/down signal by comparing the oscillation voltage signal with a reference threshold;
generating a counting signal according to the up/down signal;
filtering the counting signal at a low frequency band; and
outputting the m-bit digital signal by performing down-sampling of the low-pass filtered signal,
wherein a number of bits of the m-bit digital signal is greater than a number of bits of the counting signal.

9. The method of claim 7,
wherein the generating a clock signal corresponding to a resonance frequency of the resonator and a gain control signal corresponding to a motional resistance of the resonator based on the oscillation voltage signal comprises:
generating a 1-bit fine signal by modulating a remaining (m-n)-bit signal generated by subtracting an n-bit coarse signal from the m-bit digital signal in a delta-sigma modulation scheme; and
generating the gain control signal by summing the n-bit coarse signal and the 1-bit fine signal.

10. The method of claim 9,
wherein the generating a clock signal corresponding to a resonance frequency of the resonator and a gain control signal corresponding to a motional resistance of the resonator based on the oscillation voltage signal further comprises
converting the oscillation voltage signal to a digital voltage signal and generating a plurality of clock signals by adjusting a phase or a frequency of the digital voltage signal,
wherein the frequency of the digital voltage signal corresponds to the resonance frequency.

11. The method of claim 10,
wherein the plurality of clock signals include a first clock signal provided to the down-mixing envelope tracker and a second clock signal provided to the delta-sigma modulator, the first clock signal has a same frequency as a frequency of the digital voltage signal, and the second clock signal has a frequency that is higher than a frequency of the m-bit digital signal.

12. The method of claim 7,
wherein a magnitude of the oscillation voltage signal is a product of a magnitude of the current signal and a magnitude of a variable resistance determined according to the gain control signal.

* * * * *